(12) United States Patent
Daubenspeck et al.

(10) Patent No.: US 7,985,671 B2
(45) Date of Patent: Jul. 26, 2011

(54) STRUCTURES AND METHODS FOR IMPROVING SOLDER BUMP CONNECTIONS IN SEMICONDUCTOR DEVICES

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/344,774

(22) Filed: Dec. 29, 2008

(65) Prior Publication Data

US 2010/0164104 A1 Jul. 1, 2010

(51) Int. Cl.
*H01L 21/44* (2006.01)
(52) U.S. Cl. ............ 438/597; 438/12; 438/13; 438/106; 438/754; 438/612; 438/613; 438/614; 257/779; 257/737; 257/E23.069; 257/738
(58) Field of Classification Search .................. 438/597, 438/106, 612–623, 12, 13, 754; 257/459, 257/748–752
See application file for complete search history.

(56) References Cited

U.S. PATENT DOCUMENTS

| | | | |
|---|---|---|---|
| 6,426,557 B1 | 7/2002 | Daubenspeck et al. | |
| 6,593,220 B1* | 7/2003 | Yu et al. ........................ | 438/612 |
| 6,622,907 B2* | 9/2003 | Fanti et al. .................... | 228/215 |
| 6,825,541 B2* | 11/2004 | Huang et al. .................. | 257/459 |
| 7,033,923 B2 | 4/2006 | Seshan | |
| 7,034,402 B1 | 4/2006 | Seshan | |
| 7,049,171 B2 | 5/2006 | Brauer | |
| 7,176,583 B2* | 2/2007 | Daubenspeck et al. ....... | 257/781 |
| 2005/0093113 A1 | 5/2005 | Lin et al. | |
| 2006/0131748 A1 | 6/2006 | Seshan | |

* cited by examiner

*Primary Examiner* — William M Brewster
*Assistant Examiner* — Wilner Jean Baptiste
(74) *Attorney, Agent, or Firm* — Richard Kotulak; Roberts Mlotkowski Safran & Cole, P.C.

(57) ABSTRACT

Structures with improved solder bump connections and methods of fabricating such structures are provided herein. The method includes forming an upper wiring layer in a dielectric layer and depositing one or more dielectric layers on the upper wiring layer. The method further includes forming a plurality of discrete trenches in the one or more dielectric layers extending to the upper wiring layer. The method further includes depositing a ball limiting metallurgy or under bump metallurgy in the plurality of discrete trenches to form discrete metal islands in contact with the upper wring layer. A solder bump is formed in electrical connection to the plurality of the discrete metal islands.

22 Claims, 5 Drawing Sheets

STRUCTURES AND METHODS FOR IMPROVING SOLDER BUMP CONNECTIONS IN SEMICONDUCTOR DEVICES

CROSS REFERENCE TO RELATED APPLICATIONS

The present application is related to co-pending U.S. application Ser. No. 12/344,802, filed on the same day herewith and incorporated by reference in its entirety herein.

FIELD OF THE INVENTION

The invention relates to integrated circuits, and more particularly, to structures with improved solder bump connections and methods of fabricating such structures.

BACKGROUND

Traditionally, high temperature C4 (Controlled Collapse Chip Connection) bumps have been used to bond a chip to a substrate with the most common and widely utilized package being an organic laminate. Conventionally, the C4 bumps (solder bumps) are made from leaded solder, as it has superior properties. For example, lead is known to mitigate thermal coefficient (TCE) mismatch between the chip and the substrate (i.e., organic laminate). Accordingly, stresses imposed during the cooling cycle are mitigated by the C4 bumps, thus preventing delaminations or other damage from occurring to the chip or the substrate.

Lead-free requirements are now being imposed by many countries forcing manufacturers to implement new ways to produce chip to substrate joints. For example, solder interconnects consisting of tin/copper, tin/silver (with high concentrations of silver) and tin/gold in combination with SAC alloys are being used as a replacement for the leaded solder interconnects. With lead-free requirements, though, concerns about defects in C4 interconnections have surfaced, e.g., cracks in chip metallurgy under C4 bumps (named "white bumps" due to their appearance in CSAM inspection processes) which lead to failure of the device. More specifically, white bumps are C4's that do not make good electrical contact to the Cu last metal pad, resulting in either failing chips at functional test or in the field. This may be attributable, at least in part, due to chip designs using high stress Pb-free C4 (solder bumps) which exacerbate C4/AlCu bump to Cu wire adhesion problems.

As one illustrative example, during the chip joining reflow, the chip and its substrate are heated to an elevated temperature (about 250° C.) in order to form the solder interconnection joints. The initial portion of the cool down leads to little stress build up; however, as the joints solidify (around 180° C. for small lead-free joints), increased stress is observed on the package. In particular, as the package (laminate, solder and chip) begins to cool, the solder begins to solidify (e.g., at about 180° C.) and the laminate begins to shrink as the chip remains substantially the same size. The difference in thermal expansion between the chip and the substrate is accommodated by out-of-plane deformation of the device and the substrate, and by the shear deformation of the solder joints. The peak stresses on the device occur during the cool down portion of the reflow.

As the solder is robust and exceeds the strength of the chip, tensile stresses begin to delaminate structures on the chip. The high shear stresses caused by the TCE mismatch between the chip (3.5 ppm) and the laminate (16 ppm) results in an interfacial failure (i.e., a separation between the BEOL copper and the dielectric (e.g., FSG) under the C4). This interfacial failure embodies itself as cracks in the chip metallurgy under C4 bumps. Additionally, there is also a tendency for Sn to diffuse down from the Pb-free solder bump through the BLM/capture pad structure and into the last-metal copper layer, due to inadequate barrier integrity in these overlying films. When this happens, the copper in the last metal level undergoes volume expansion in reaction with the Sn, and creates a crack.

Accordingly, there exists a need in the art to overcome the deficiencies and limitations described hereinabove.

SUMMARY

In a first aspect of the invention, a method of manufacturing a semiconductor structure comprises forming an upper wiring layer in a dielectric layer and depositing one or more dielectric layers on the upper wiring layer. The method further comprises forming a plurality of discrete trenches in the one or more dielectric layers extending to the upper wiring layer. The method further comprises depositing a ball limiting metallurgy or under bump metallurgy in the plurality of discrete trenches to form discrete metal islands in contact with the upper wring layer. A solder bump is formed in electrical connection to the plurality of the discrete metal islands.

In a second aspect of the invention, a method of manufacturing a package comprises: forming a plurality of discrete trenches in one or more dielectric layers extending to an underlying wiring layer; depositing a metal material in the discrete trenches which form islands of under bump metallurgy or ball limiting metallurgy in contact with the underlying wiring layer; depositing a lead free solder bump in electrical connection to the islands; and bonding a laminate structure to the lead free solder bump.

In a third aspect of the invention, a solder bump structure comprises a plurality of metal islands of under bump metallurgy or ball limiting metallurgy formed in one or more dielectric layers and in contact with an upper wiring layer in a lower dielectric layer. A solder bump is in electrical connection with the metal islands.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to structures with improved solder bump connections and methods of fabricating such structures. More specifically, the present invention provides structures and methods of manufacturing such structures which stops cracks or delamination from occurring in underlying BEOL (back end of line) vias and related metal interconnects and/or pads and/or wires. For example, in implementation, the present invention prevents C4 stresses from being translated to an entire wiring level where it can result in a catastrophic wiring failure. This can be accomplished by providing discrete metal islands or segments of under bump or ball limiting metallurgy, which prevent stresses imposed during a cooling period from delaminating an entire wiring layer, rending the device inoperable.

The present invention is applicable to all C4 processes, including plating, screening, and physical placement methods such as, for example, C4NP (Controlled Collapse Chip Connection New Process). C4NP, pioneered by International Business Machines Corp., provides flip chip technology combining the advantages of 100 percent lead-free, high reliability, fine pitch, lower material cost, as well as the flexibility to use virtually all types of solder compositions. The processes and structures herein can be used for known and upcoming generations, and is especially applicable to 300 mm wafer technology using C4NP. Accordingly, the processes of the present invention will provide benefits for future copper wiring generations.

Figure 1:
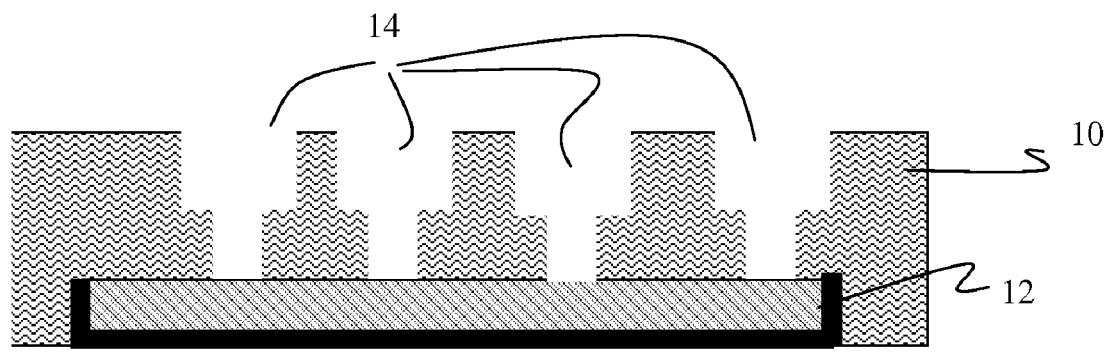
FIGS. 1-8 show structures and respective processing steps in accordance with aspects of the invention.

In particular, FIG. 1 shows a beginning structure comprising a lower metal layer 12 formed in a dielectric material 10. The lower metal layer 12 may be, for example, a copper material lined with a diffusion barrier layer of tantalum nitride, for example. Those of skill in the art will recognize that the metal layer 12 is not limited to copper lined with tantalum nitride, but may be, for example, any conductive metal lined titanium nitride or other diffusion barrier layers. The dielectric material 10 may be, for example, $SiO_2$.

A plurality of trenches 14 is formed in the dielectric material 10, extending to the underlying metal layer 12, e.g., wire. The trenches 14 form isolated, discrete segments, which are designed to prevent crack stops from affecting an entire metal layer (which would otherwise result in device failure). The trenches 14 can be formed using any conventional lithographic and etching processes. For example, the formation of the trenches 14 can be processed using conventional photolithography using a masking layer exposed to light to form openings, and a subsequent etching (e.g., reactive ion etching (RIE)) technique to form the trenches 14 in the dielectric material 10. This may be a two step etching process in that the trenches include two different cross sectional shapes. As these are conventional processes, further explanation is not required for a person of ordinary skill in the art to practice the invention.

The trenches 14 can range from 1 micron to 10 microns across and can be several different shapes and sizes (e.g., smaller and larger openings). The trenches 14 can include radial or arc-shaped offset segments surrounding several sized openings. In embodiments, the trenches 14 can include patterns of one or more openings or shapes such as a grid pattern, checkerboard pattern, segmented lines, overlapping lines, offset lines, perpendicular lines, arc segments or any combination discussed herein.

In an alternate embodiment (FIG. 3b), the plurality of trenches 14 can be a single trench to form a conventional wiring layer. The trench 14, as discussed below, can be lined with a diffusion barrier layer and filled with a copper or other conductive material to form an upper wiring level. In this implementation, the processes will continue with that of FIG. 4.

Figure 2:
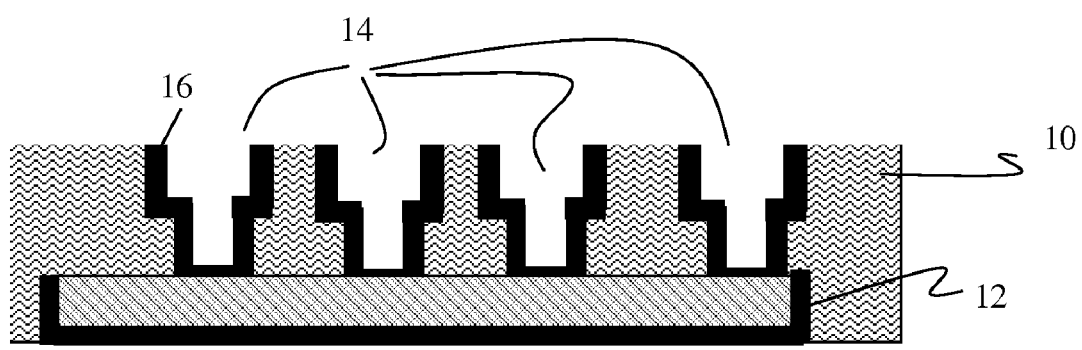

FIG. 2 shows a metal liner 16, e.g., diffusion barrier layer, deposited in the trenches 14. The metal liner 16 may be, for example, a tantalum nitride material. The metal liner 16 is deposited using a conventional deposition method such as physical vapor deposition (PVD), for example, although other deposition techniques can also be used with the present invention, e.g., chemical vapor deposition (CVD). A chemical mechanical polishing (CMP) can be performed to planarize the surface of the structure of FIG. 2.

Figure 3A:
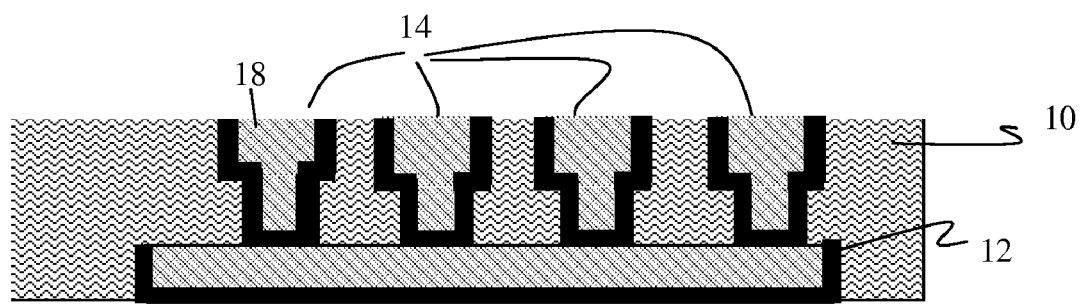

In FIG. 3a, a metal material 18 is deposited in the trenches 14. The metal material 18 may be used to form an upper wiring level. More specifically, the metal material 18 may be BEOL wiring structures formed in trenches of the dielectric layer 10. The copper wirings 18 are segmented (due to the arrangement of the trenches) which form discrete islands such that stresses imposed on the structure will only delaminate an outer island, and will not affect the entire metal layer. This will prevent device failure from occurring when stresses are imposed on the structure. A chemical mechanical polishing (CMP) can also be performed to planarize the surface of the structure of FIG. 3a.

Figure 3B:
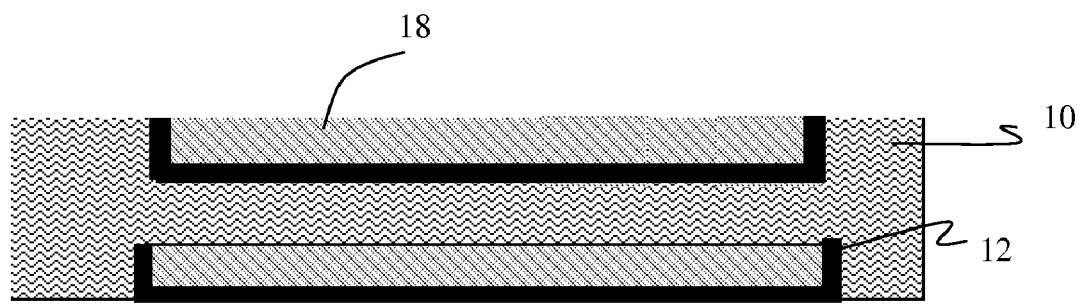

In an alternate embodiment shown in FIG. 3b, the plurality of trenches 14 can be a single trench to form a conventional wiring layer. The trench 14 can be lined with a diffusion barrier layer and filled with copper or other conductive material to form an upper wiring level. In this implementation, the processes will continue with that of FIG. 4.

Figure 4:
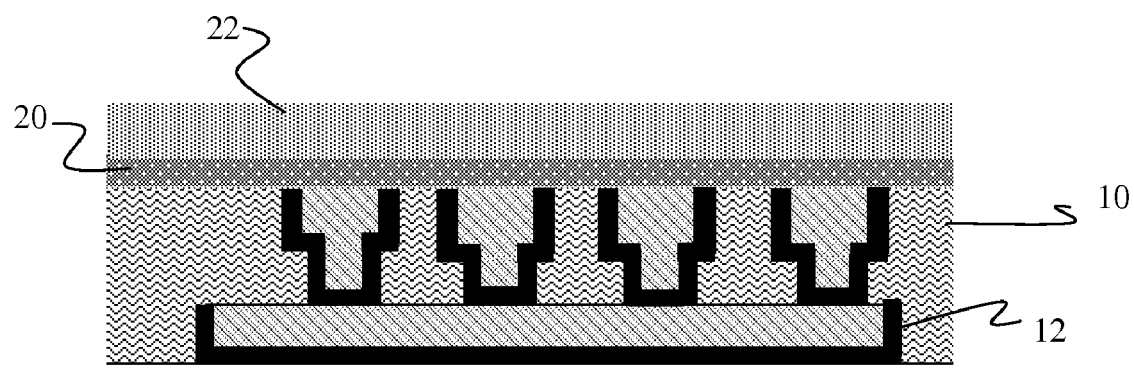

In FIG. 4, dielectric layers 20, 22 are deposited on the planarized surface of the structure of FIG. 3a or FIG. 3b. In either scenario, the dielectric layer 20 may be, for example, SiN. Alternatively, the dielectric layer 20 may be a layered structure of SiN, $SiO_2$ and SiN. The dielectric layer 22 may be a photosensitive polyimide or other type of insulative material deposited on the dielectric layer 20. The dielectric layers 20, 22 can be deposited using a conventional deposition technique such as, for example, CVD. In embodiments, the dielectric layers 20, 22 can range in thickness from about 5 to 10 microns in height; although other dimensions are also contemplated by the invention. In the case of photosensitive polyimide, the dielectric layer 22 can be about 5 microns in thickness.

Figure 5:
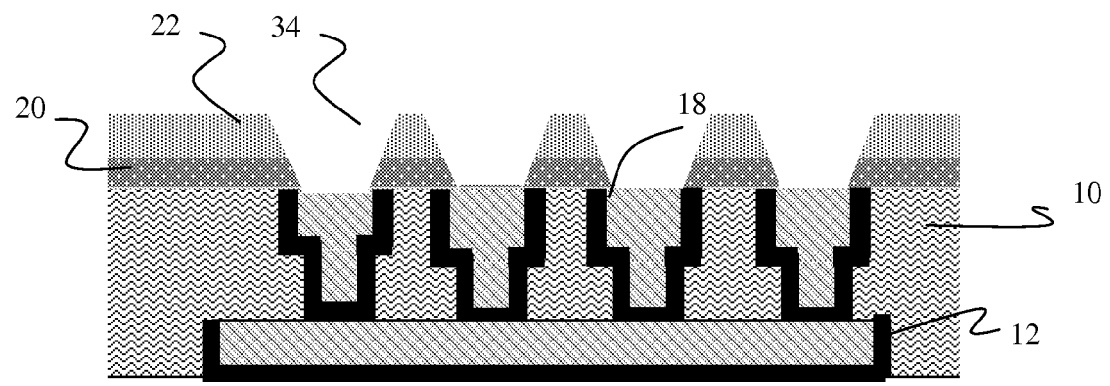

Referring to FIG. 5, the dielectric layers 20, 22 are subject to a patterning step in order to form a plurality of discrete vias 34. The plurality of discrete vias 34 can be about 1 micron in width or diameter, depending of the shape; although this dimension should not be considered a limiting feature of the present invention. In embodiments, the plurality of vias 34 can range from 1 micron to 10 microns across and can be several different shapes and sizes (e.g., smaller and larger openings). The plurality of vias 34 can be, for example, radial or arc-shaped offset segments surrounding the several sized openings. In embodiments, the plurality of vias 34 can be patterns of one or more openings or shapes such as a grid pattern, checkerboard pattern, segmented lines, overlapping lines, offset lines, perpendicular lines, arc segments and any combination discussed herein.

In embodiments, the plurality of discrete vias 34 will stop crack formation, as discussed further below. The discrete vias 34 can be formed in any conventional manner such as, for example, exposure and development, without the need for a conventional etching process (e.g., RIE), for a PSPI layer. Alternatively, a conventional lithography and etching processes can be used to from the vias 34. The vias 34 are aligned with and extend to the metal material 18.

Figure 6:
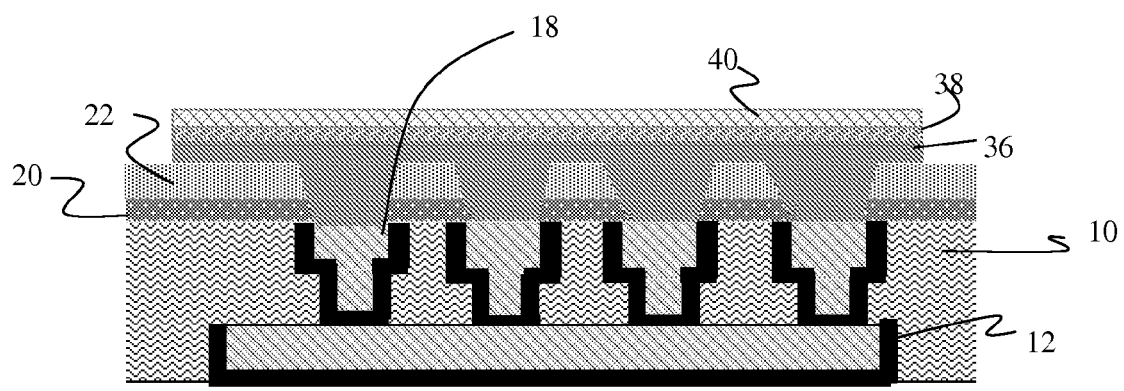

As shown in FIG. 6, a metal material 36 is deposited in the vias 34, in contact with the metal material 18. The metal material 36 may be, for example, TaN or TiW. The metal in the discrete vias will result in discrete islands which form a portion of the ball limiting metallurgy (BLM) or under bump metallurgy (ULM). In the vias 34, the metal material 36 can be, for example, about 0.55 microns in thickness (or slightly greater than ½ the diameter of the vias 34). This will allow the metal material 36 to extend above the layer 22. Another metal layer 38 such as, for example, a conductive pad composed of Al or copper, is deposited on the metal material 36. In embodiments, the metal layer 38 is an optional layer. A CrCu or Cu layer 40 can be deposited on the metal layer 38 to form a capture pad. The metal layers 36, 38, 40 can be deposited using conventional deposition techniques such as, for example, CVD.

Figure 7:
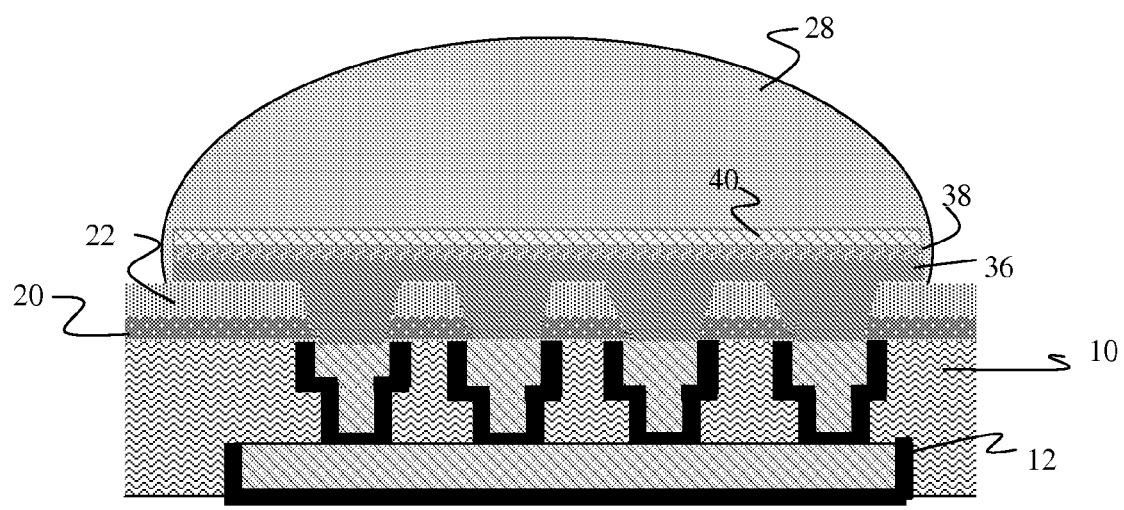

In FIG. 7, a solder bump is deposited on the metal layer 40. More specifically, a lead-free solder bump 28 such as, for example, tin/copper, tin/silver and tin/gold in combination with SAC alloys, is deposited on the metal layer 40.

Figure 8:
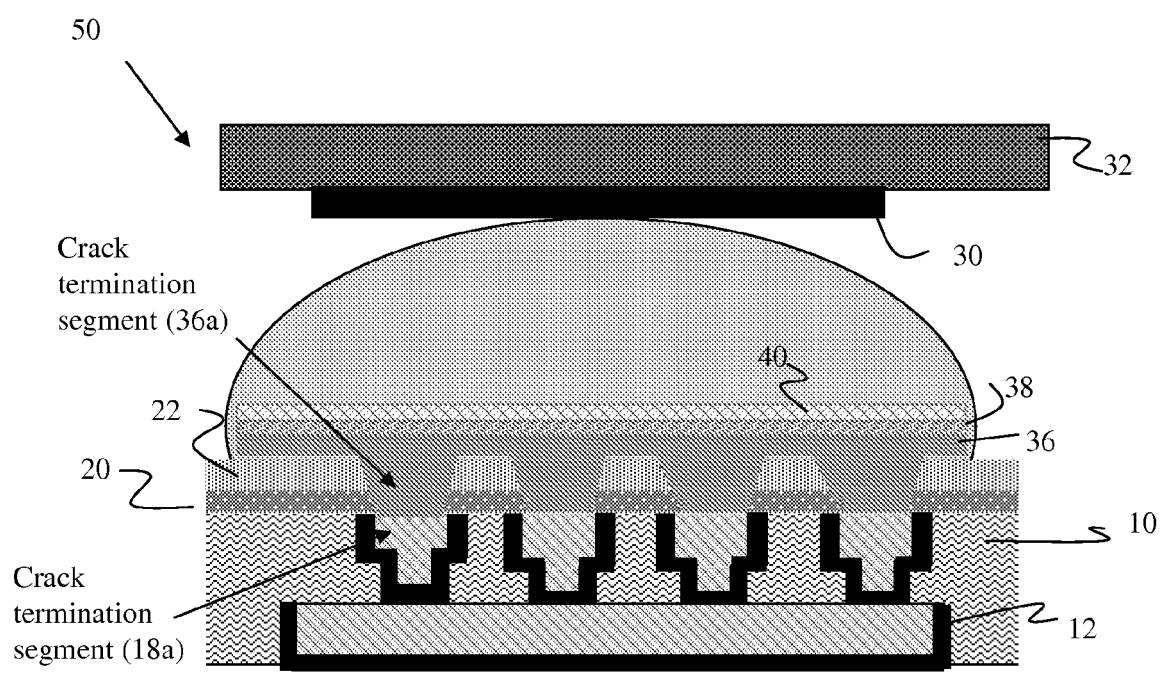

FIG. 8 shows a packaged chip generally designated as reference numeral 50. The packaged chip 50 shows the solder bump 28 connected to a bonding pad 30 of a laminate 32. The laminate 32 can be an organic or ceramic laminate. FIG. 8 also graphically shows crack initiation and termination in BLM segment (capture pad 30).

Those of skill in the art should now understand that the present invention adds an additional segmentation pattern designed to prevent delamination of an entire wiring layer. With the additional segmentation pattern, stresses will be interrupted at a periphery of the wiring layer which, in turn, acts as a termination point for the propagation of any crack. That is, the outer peripheral segment or island of the TaN/TiW layer 36a (in addition to the segment 18a, if the embodiment shown in FIGS. 1-3a is used in combination) will cause an interruption of the stresses which, in turn, acts as termination points for the propagation of the crack. In this way, any initiated crack will stop at a single interconnect and hence not propagate along the entire interface between the intermetallic (IMC) compound in the BLM and the solder material. This structure is applicable to any two parts being joined with a C4 solder bump, particularly for lead free C4s, and including any chip stacking or "3D" application.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of manufacturing a semiconductor structure, comprising:
   forming a plurality of discrete trenches in a dielectric layer;
   depositing an upper wiring layer material in the plurality of discrete trenches to form discrete upper wiring layer islands of an upper wiring layer in the dielectric layer;
   depositing one or more dielectric layers on the discrete upper wiring layer islands of the upper wiring layer;
   forming a plurality of discrete vias in the one or more dielectric layers, the plurality of discrete vias extending to the upper wiring layer;
   depositing a ball limiting metallurgy or under bump metallurgy in the plurality of discrete vias to form discrete metal islands in contact with the upper wiring layer; and
   forming a solder bump in electrical connection to the plurality of the discrete metal islands.

2. The method of claim 1, further comprising forming metal layers between the solder bump and the plurality of discrete metal islands.

3. The method of claim 2, wherein the metal layers include a capture pad and a conductive pad.

4. The method of claim 3, wherein the capture pad is deposited over the conductive pad and includes a nickel material sandwiched between an upper gold layer and a bottom barrier layer.

5. The method of claim 1, wherein the bump metallurgy or ball limiting metallurgy includes a refractory metal base layer, a conductive metal interlayer and a diffusion barrier top-layer.

6. The method of claim 1, wherein the solder bump is a lead free solder bump.

7. The method of claim 1, wherein the forming of the plurality of discrete vias includes etching openings of various sizes and shapes in the one or more dielectric layers.

8. The method of claim 1, wherein the one or more dielectric layers is two dielectric layers.

9. The method of claim 1, wherein the discrete metal islands contact the discrete upper wiring layer islands.

10. A method of manufacturing a package, comprising:
    forming a plurality of discrete trenches in a lower dielectric layer;
    filling the plurality of discrete trenches with conductive material which contacts an underlying metal line, to form a metal layer;
    forming a plurality of discrete vias in one or more dielectric layers, the plurality of discrete vias extending to the plurality of discrete trenches filled with the conductive material of the underlying metal layer;
    depositing a metal material in the discrete vias which form islands of under bump metallurgy or ball limiting metallurgy in contact with the underlying metal layer;
    depositing a lead free solder bump in electrical connection to the islands; and
    bonding a laminate structure to the lead free solder bump.

11. The method of claim 10, further comprising forming a capture pad and a conductive pad between the solder bump and the islands.

12. The method of claim 10, wherein the forming of the plurality of discrete vias includes forming openings of various sizes and shapes in the one or more dielectric layers.

13. The method of claim 10, wherein the plurality of discrete trenches filled with the conductive material contacts the islands.

14. A solder bump structure, comprising:
a plurality of discrete trenches filled with a conductive material formed in a lower dielectric layer;
a plurality of metal islands of under bump metallurgy or ball limiting metallurgy formed in one or more dielectric layers and in contact with an upper wiring layer comprising the plurality of discrete trenches filled with the conductive material in the lower dielectric layer; and
a solder bump in electrical connection with the metal islands.

15. The structure of claim 14, further comprising a laminate bonded to the solder bump, wherein the solder bump is a lead free solder bump.

16. The structure of claim 14, wherein the metal islands are composed of TaN or TiW.

17. The structure of claim 14, wherein the plurality of discrete trenches filled with the conductive material formed in the lower dielectric layer are aligned and in electrical contact with the metal islands.

18. The structure of claim 16, wherein the conductive material is a diffusion barrier layer and copper.

19. The structure of claim 14, wherein the metal islands are of various sizes and shapes.

20. The method of claim 9, wherein:
the discrete metal islands are aligned with the discrete upper wiring layer islands;
the upper wiring layer material in each respective discrete trench contacts the ball limiting metallurgy or under bump metallurgy in each respectively aligned discrete via;
the upper wiring layer material comprises a metal liner comprising a tantalum nitride material, and copper;
the method further comprises depositing a metal material of the ball limiting metallurgy or under bump metallurgy in the plurality of discrete vias, the metal material completely filling the plurality of discrete vias and comprising one of tantalum nitride or titanium tungsten; and
the discrete upper wiring layer islands contact an underlying metal line comprising a metal layer formed in a dielectric material.

21. The method of claim 13, wherein:
the plurality of discrete vias are aligned with the plurality of discrete trenches filled with the conductive material;
the conductive material in each respective discrete trench contacts the metal material in each respectively aligned discrete via;
the conductive material comprises a metal liner comprising a tantalum nitride material, and copper;
the metal material comprises a single metal material of the ball limiting metallurgy or under bump metallurgy, the single metal material completely filling the plurality of discrete vias and comprising one of tantalum nitride or titanium tungsten; and
the underlying metal line comprises a lower metal layer formed in a dielectric material.

22. The structure of claim 17, wherein:
the conductive material in each respective discrete trench contacts the under bump metallurgy or ball limiting metallurgy in each respectively aligned metal island;
the conductive material comprises a metal liner comprising a tantalum nitride material, and copper;
the plurality of metal islands are completely filled with a metal material of the ball limiting metallurgy or under bump metallurgy, the metal material comprising one of tantalum nitride or titanium tungsten; and
the structure further comprises a metal line comprising a metal layer formed in a dielectric material, the plurality of discrete trenches filled with the conductive material contacting the metal line.

* * * * *